United States Patent
Yen

[19]

[11] Patent Number: 5,965,924
[45] Date of Patent: *Oct. 12, 1999

[54] METAL PLUG LOCAL INTERCONNECT

[75] Inventor: Ting P. Yen, Fremont, Calif.

[73] Assignee: Cypress Semiconductor Corp., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/900,047

[22] Filed: Jul. 24, 1997

Related U.S. Application Data

[63] Continuation of application No. 08/561,951, Nov. 22, 1995, abandoned.

[51] Int. Cl.$^6$ .............................. H01L 29/76; H01L 29/94
[52] U.S. Cl. .................... 257/383; 257/382; 257/388; 257/903; 438/647; 438/649
[58] Field of Search .................... 257/382, 383, 257/387, 388, 903; 437/190, 192; 438/647, 649

[56] References Cited

U.S. PATENT DOCUMENTS

| | | | |
|---|---|---|---|
| 4,566,175 | 1/1986 | Smayling et al. | 29/576 |
| 4,746,219 | 5/1988 | Holloway et al. | 357/23.11 |
| 4,878,100 | 10/1989 | McDavid | 357/23.3 |
| 4,962,060 | 10/1990 | Sliwa et al. | 437/192 |
| 5,053,351 | 10/1991 | Fazan et al. | 437/52 |
| 5,103,272 | 4/1992 | Nishiyama | 257/388 |
| 5,202,279 | 4/1993 | Chung et al. | 437/47 |
| 5,245,210 | 9/1993 | Nishigoori | 257/383 |
| 5,286,674 | 2/1994 | Roth et al. | 437/190 |
| 5,313,089 | 5/1994 | Jones, Jr. | 257/295 |
| 5,453,640 | 9/1995 | Kinoshita | 257/383 |
| 5,459,354 | 10/1995 | Hara | 257/754 |
| 5,521,118 | 5/1996 | Lam et al. | 437/180 |
| 5,541,427 | 7/1996 | Chappell et al. | 257/306 |
| 5,541,434 | 7/1996 | Nicholls et al. | 257/383 |
| 5,600,170 | 2/1997 | Sugiyama et al. | 257/382 |

FOREIGN PATENT DOCUMENTS

| | | | |
|---|---|---|---|
| 2246369 | 10/1990 | Japan | 257/383 |
| 0621372 | 1/1994 | Japan | 257/383 |

OTHER PUBLICATIONS

Silicon Processing For The VLSI Era, Vol. 2: Process Integration; Stanley olf, Ph.D.; pp. 144–145, 212–214, and 354–355.

Primary Examiner—Valencia Martin-Wallace
Attorney, Agent, or Firm—Christopher P. Maiorana, P.C.

[57] ABSTRACT

A semiconductor structure that includes a silicon substrate which has a top surface, a diffusion region formed in the substrate adjacent to the top surface, a polysilicon gate formed on the top surface of the substrate adjacent to but not contacting the diffusion region, an insulator layer substantially covers the polysilicon gate and the diffusion region, the layer contains a via opening therein, and an electrically conducting plug filling at least partially the via opening providing electrical communication between the polysilicon gate and the diffusion region.

17 Claims, 1 Drawing Sheet

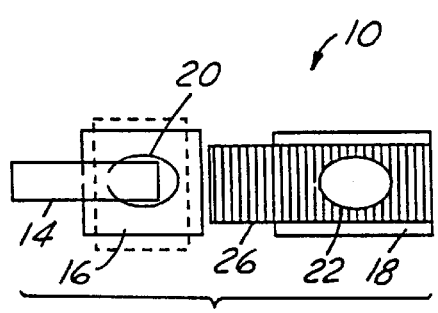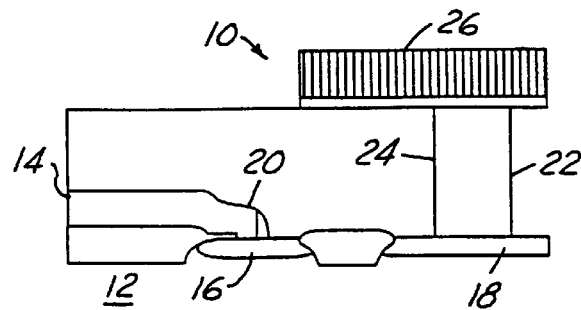
FIG.1A  FIG.1B
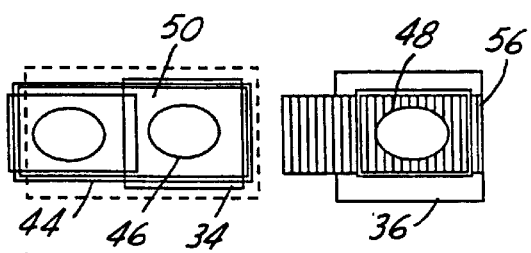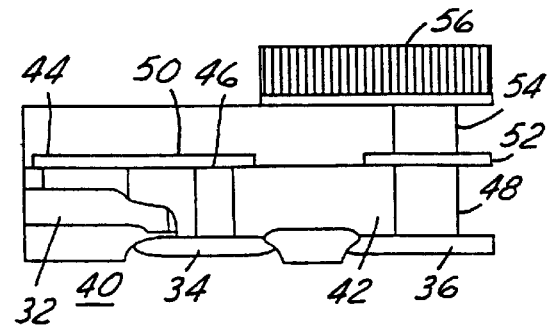
FIG.2A  FIG.2B
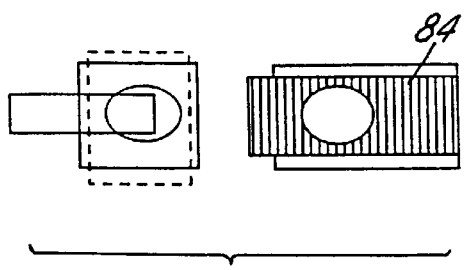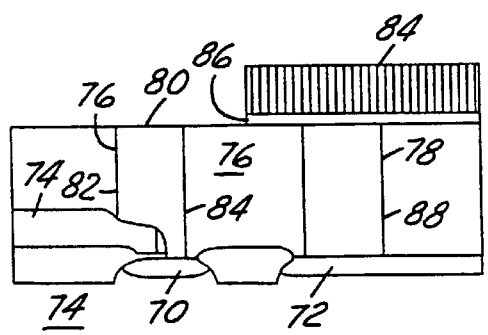
FIG.3A  FIG.3B

METAL PLUG LOCAL INTERCONNECT

This is a Continuation of U.S. patent application Ser. No. 08/561,951, filed Nov. 22, 1995 now abandoned.

FIELD OF THE INVENTION

The present invention generally relates to a metal plug local interconnect and a method of making the same, and more particularly, relates to a metal plug local interconnect which is formed in the same process of forming metal plugs that are already designed as sub-metal plugged contacts and a method of making the same.

BACKGROUND OF THE INVENTION

In the semiconductor fabrication process, it is frequently required to make local interconnect between a gate polysilicon layer to N+ and P+ diffusion regions. In the conventional art, this can be accomplished by using buried contacts to provide the necessary electrical connections. A buried contact is formed by the physical contact of a polysilicon layer which is substantially polycrystalline silicon to a region doped by impurity ions in a semiconductor substrate. Buried contacts are most commonly used in a CMOS type of memory circuits.

An enlarged top view and cross-sectional view of a conventional buried contact is shown in FIGS. 1A and 1B, respectively. In a typical fabrication process for buried contacts, a gate oxide layer (not shown) is first deposited on the surface of a silicon substrate 12. On top of the gate oxide layer, a thin layer of polysilicon (not shown) is then deposited to protect the gate oxide layer from contamination. The gate oxide layer and the polysilicon layer are then patterned by a photoresist masking process and etched. Openings (not shown) are formed on the surface of substrate 12 to expose sections of the substrate for the formation of buried contacts. An ion implantation process is performed at the openings to increase the surface dopant concentration for improved contact resistance. Subsequently, the photoresist layer is removed and a layer of polysilicon is deposited onto substrate 12. Thereafter, the polysilicon layer is patterned and etched, typically by a reactive ion etching method, to form a gate electrode 14 for making electrical connection with the diffusion region 16. Metal silicides may be used to reduce the resistivity of the polysilicon interconnect. The metal silicides offer the advantage of lower resistivity while retaining silicon gate characteristics. A BPSG planarization step completes the buried contact fabrication process.

Electrical connection to the other diffusion region 18 can be made by metal contact 22 by first performing a contact masking and etching process. After the formation of the contact holes 24, a thin layer of titanium tungsten or titanium nitride is normally deposited into the contact hole to improve adhesion. A refractory metal plug such as a tungsten plug is then deposited into hole 24. After a tungsten plug etch back process, a metal I layer 26 is deposited to provide connection to other devices.

In order to make a local interconnect from a gate polysilicon to both N+ and P+ diffusion regions by using a conventional buried contact, a complex set of processing steps must be added. This is because that gate polysilicon requires to be doped to both P+ and N+ depending on the diffusion doping the polysilicon is strapping to. Furthermore, in order to minimize inter-diffusion between N+ and P+ doping in polysilicon, additional processing steps are required to lower the diffusivity. This becomes more difficult as design rules are scaled down to the sub-micron range.

There are still other disadvantages of using a buried contact process. For instance, to avoid dopant penetration into the channel region, a P+ doped polysilicon needs to be implanted with the very low energy B11 instead of BF2 to avoid F+ enhanced dopant diffusion. This results in poor manufacturability. For a tungsten polycide process, the buried contact method does not allow an in-situ deposited and doped polysilicon/tungsten silicide structure. The buried contact method also makes it difficult to match the P+ doped and the N+ doped polycide sheet resistance in the case of a titanium silicide process.

Other workers in the field of local interconnects have proposed methods to overcome the drawbacks and disadvantages of the conventional buried contact process. One of such methods is to use a metallic local interconnect strap to shunt from a gate polysilicon to a diffusion region. A typical process is shown in FIGS. 2A and 2B where an enlarged top view and cross-sectional view is shown, respectively. In a local interconnect strap method, a polysilicon gate 32 is first formed without direct contact with the diffusion regions 34 and 36 in a silicon substrate 40. An insulating layer 42 of dielectric material is then deposited on top of the polysilicon and the diffusion regions. Vias are opened through masking/etching processes in the insulator layer 42. After the deposition of a glue layer (not shown), metal plugs 44, 46 and 48 are deposited into the vias. After a tungsten plug etch back and a local interconnect masking/etching process, a local interconnect shunt layer 50 is deposited. A separate shunt 52 is also deposited on metal plug 48 to allow the deposition of another metal plug 54 such that diffusion region 36 can be connected to the Metal I layer 56. The second metal plug 54 is formed in a via opened in the second insulating layer 60 of a dielectric material.

The local interconnect strap method, even though accomplishes the electrical connection between a polysilicon gate and a diffusion region, is a process-intensive method. For instance, it requires the additional processing steps of depositing an insulating layer between the local interconnect and the gate polysilicon, of opening vias in an insulating layer, of patterning and depositing the local interconnect layer. Moreover, from a topological standpoint, the process requires much larger layout area than a buried contact at the intersection of the gate polysilicon to the diffusion region.

It is therefore an object of the present invention to provide a local interconnect between a polysilicon gate and a diffusion region that does not have the drawbacks and shortcomings of the prior art interconnect.

It is another object of the present invention to provide a metal plug local interconnect for connecting a polysilicon gate to a diffusion region.

It is a further object of the present invention to provide a metal plug interconnect between a polysilicon gate and a diffusion region that only requires a minimal number of additional processing steps.

It is still another object of the present invention to provide a metal plug local interconnect that does not require the formation of a buried contacts.

It is yet another object of the present invention to provide a metal plug local interconnect between a polysilicon gate and a diffusion region that does not require the use of a local interconnect strap.

It is another further object of the present invention to provide a metal plug local interconnect between a polysilicon gate and a diffusion region wherein the metal plug local shunt can be formed in a single metal contact formation step.

SUMMARY OF THE INVENTION

In accordance with the present invention, a metal plug local interconnect between a polysilicon gate and a diffusion region and a method of making the same are provided.

In a preferred embodiment, a semiconductor structure is provided which includes a silicon substrate having a top surface, a diffusion region formed in the substrate adjacent to the top surface, a polysilicon gate formed on the top surface of the substrate adjacent to but not contacting the diffusion region, an insulator layer which covers the polysilicon gate and the diffusion region, the layer contains a via opening therein, and an electrically conducting plug filling at least partially the via opening to provide electrical connection between the polysilicon gate and the diffusion region.

The present invention is further directed to a method of making a metal plug local interconnect in a semiconductor structure. The method includes the steps of first providing a silicon substrate that has a top surface, then forming a diffusion region in the substrate adjacent to the top surface, then forming a polysilicon gate on the top surface of the substrate adjacent to but not contacting the diffusion region, then depositing a layer of an insulating material on top of the polysilicon gate and the diffusion region, then forming a via in the layer of insulating material exposing at least a portion of the polysilicon gate and a portion of the diffusion region, and then depositing an electrically conducting material and filling at least partially the via opening such that the electrically conducting material contacts the polysilicon gate and the diffusion region and provides electrical communication therein between.

BRIEF DESCRIPTION OF THE DRAWINGS

FIGS. 1A and 1B show a top view and a cross-sectional view of a conventional buried contact.

FIGS. 2A and 2B show a conventional buried contact process.

FIGS. 3A and 3B show a top view and a cross-sectional view of a preferred embodiment of the present invention.

DETAILED DESCRIPTION OF THE PREFERRED EMBODIMENT

The present invention provides a semiconductor structure that has a metal plug local interconnect (or shunt) for connecting a polysilicon gate to a diffusion region in a structure and a method of forming such a semiconductor structure.

Referring initially to FIGS. 3A and 3B wherein an enlarged top view and a cross-sectional view of the present invention metal plug local interconnect is shown, respectively. Diffusion regions 70 and 72 of either N+ or P+ doping are first formed by an ion implantation process in the surface of the silicon substrate 74. This is accomplished by patterning through a photoresist layer and then etching to form openings for the diffusion regions for the ion implantation process. The photoresist layer is used as an implantation mask. The photoresist layer is then removed and polysilicon is deposited onto substrate 74. Thereafter, the polysilicon layer is patterned and etched by a reactive ion etching process to form gate electrode 74. This is shown in FIG. 3B.

To form the present invention metal plug local interconnect for connecting polysilicon gate 74 to the diffusion region 70, an insulating layer 76 of silicon oxide is first deposited on top of the polysilicon gate 74 and the diffusion regions 70 and 72. In the same process of making sub-metal plugged contacts on the device, an additional via opening 78 is provided for placing a metallic plug contact where the polysilicon gate is required to shunt to the diffusion region. A regular via opening 78 for a sub-metal plug contact is also formed during the same via opening process. After the vias 76 and 78 are opened by a photoresist masking/etching process, a conducting metal is used to fill the via by a sputtering process. Any conducting metal can be used, even though refractory metals are preferred. For instance, refractory metals of Ti, Ta and Mo are most frequently used. A metal plug local interconnect 80 thus formed interconnects the polysilicon gate at 82 and the diffusion region 70 at 84. Electrical contacts to both P+ and N+ diffusion regions can be achieved independent of the polysilicon doping. It should be noted that topologically, the present invention method does not require more layout area than a conventional buried contact method. Moreover, the present invention method requires substantially less layout area than a local interconnect strapping method. After a tungsten plug etch back process, a Metal I layer 84 is deposited with a glue layer 86 in between the Metal I layer 84 and the metal plug 88.

The present invention metal plug local interconnect can be fabricated in a process that has substantially lesser number of processing steps required than either a conventional buried contact process or a local interconnect strapping process. For instance, the present invention method saves 8~11 steps over a conventional buried contact process and saves 6~8 steps over a local interconnect strapping process. This is shown in the following process flow charts.

| Conventional Buried Contact Process |
|---|
| Step #1 - thin poly deposition |
| #2 - BC1 mask |
| #3 - BC1 etch |
| #4 - (BC implantation mask) |
| #5 - (BC P+ implantation) |
| #6 - (BC N+ implantation) |
| #7 - Amorp Si deposition |
| #8 - N+ Implantation |
| #9 - P+ poly mask |
| #10 - P+ poly implantation |
| #11 - Si Recryst 8 hr+ |
| #12 - WSix deposition |
| #13 - Nit/BPSG |
| STEP 14 THROUGH 21 NOT REQUIRED |
| #22 - Contact mask/etch |
| #23 - Glue deposition |
| #24 - W-plug |
| #25 - WEB |
| #26 - Metal I |
| TOTAL PROCESSING STEPS = 18 |

| Local Interconnect Strapping Process |
|---|
| STEPS 1 THROUGH 11 NOT REQUIRED |
| Step #12 - Insitu dope Poly/WSix |
| #13 - Nit/BPSG (ILD1) |
| #14 - Licon mask |
| #15 - Licon etch |
| #16 - Glue/LI deposition |
| #17 - (W-plug) |
| #18 - (WEB) |
| #19 - Li mask |
| #20 - Li etch |
| #21 - ILD2 deposition |
| #22 - Contact mask/etch |
| #23 - Glue2 deposition |
| #24 - W-deposition 2 |
| #25 - WEB2 |
| #26 - Metal I |
| TOTAL PROCESSING STEPS = 15 |

```
Metal Plug Local Interconnect Process

STEPS 1 THROUGH 11 NOT REQUIRED
     Step #12 - Insitu dope Poly/WSix
          #13 - Nit/BPSG
STEPS 14 THROUGH 21 NOT REQUIRED
          #22 - Contact mask/etch
          #23 - Glue deposition
          #24 - W-plug
          #25 - WEB
          #26 - Metal I
     TOTAL PROCESSING STEPS = 7
```

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege are defined as follows:

I claim:

1. A semiconductor structure comprising:
   a silicon substrate having a top surface,
   a diffusion region formed in said substrate adjacent to said top surface,
   a gate formed on the top surface of said substrate juxtaposed to but not contacting said diffusion region,
   a sidewall spacer adjacent to said gate and disposed above said diffusion region,
   an insulator layer substantially covering said gate and said diffusion region, and
   a conducting plug at least partially filling a via in said insulation layer that exposes said sidewall spacer in the absence of said conducting plug, said conducting plug providing direct electrical communication between said gate and said diffusion region.

2. A semiconductor structure according to claim 1, wherein said diffusion region is an N+ or a P+ region.

3. A semiconductor structure according to claim 1, wherein said insulator layer is formed of a material selected from the group consisting of silicon oxide and silicon nitride.

4. A semiconductor structure according to claim 1, wherein said electrically conducting plug is a metal plug.

5. A semiconductor structure according to claim 1, wherein said electrically conducting plug is a refractory metal plug.

6. A semiconductor structure according to claim 1, wherein said electrically conducting plug is formed of a material selected from the group consisting of titanium, tantalum, molybdenum and tungsten.

7. A method of forming a local interconnect in a semiconductor structure, comprising the step of:
   depositing an electrically conducting material in a via exposing at least a portion of a gate, a sidewall spacer adjacent to said gate and a portion of a diffusion region such that said electrically conducting material contacts and provides electrical communication between said gate and said diffusion region, said semiconductor structure comprising said diffusion region in a silicon substrate, said gate being on said substrate juxtaposed to but not contacting said diffusion region, said sidewall spacer being disposed above said diffusion region, said via being in an insulating material on said gate.

8. A method according to claim 7, wherein said diffusion region is an N+ or a P+ region.

9. A method according to claim 7, wherein said insulating material is selected from the group consisting of silicon oxide and silicon nitride.

10. A method according to claim 7, wherein said electrically conducting plug is a metal plug.

11. A method according to claim 7, wherein said electrically conducting plug is preferably a refractory metal plug.

12. A method according to claim 7, wherein said electrically conducting plug is formed of a material selected from the group consisting of titanium, tantalum, molybdenum and tungsten.

13. A semiconductor structure according to claim 1, wherein said conducting plug comprises an outer glue layer and a plug material therein.

14. A semiconductor structure according to claim 1, wherein said polysilicon gate and said diffusion region being exposed in said via in the absence of said conducting plug.

15. A method according to claim 7, wherein said gate is a polysilicon gate.

16. The structure according to claim 1, wherein said gate comprises polysilicon.

17. The method according to claim 7, wherein said gate comprises polysilicon.

* * * * *